United States Patent
Nakahori et al.

(10) Patent No.: US 10,355,666 B2
(45) Date of Patent: Jul. 16, 2019

(54) VARIABLE FILTER CIRCUIT

(71) Applicant: Murata Manufacturing Co., Ltd., Kyoto (JP)

(72) Inventors: Manabu Nakahori, Kyoto (JP); Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 57 days.

(21) Appl. No.: 15/617,355

(22) Filed: Jun. 8, 2017

(65) Prior Publication Data

US 2017/0272055 A1   Sep. 21, 2017

Related U.S. Application Data

(63) Continuation of application No. PCT/JP2015/084488, filed on Dec. 9, 2015.

(30) Foreign Application Priority Data

Dec. 10, 2014  (JP) ................................ 2014-249531

(51) Int. Cl.
*H03H 9/54*   (2006.01)
*H03H 9/64*   (2006.01)
(Continued)

(52) U.S. Cl.
CPC .......... *H03H 9/542* (2013.01); *H03H 7/0153* (2013.01); *H03H 9/605* (2013.01);
(Continued)

(58) Field of Classification Search
CPC .... H03H 9/542; H03H 9/6483; H03H 7/0153; H03H 9/605; H03H 9/6403; H03H 2210/025; H03H 2210/012
(Continued)

(56) References Cited

U.S. PATENT DOCUMENTS

| | | | |
|---|---|---|---|
| 5,528,581 A | 6/1996 | De Bot | |
| 2004/0058664 A1 | 3/2004 | Yamamoto et al. | |

(Continued)

FOREIGN PATENT DOCUMENTS

| | | |
|---|---|---|
| JP | H06-232793 A | 8/1994 |
| JP | 2004-135322 A | 4/2004 |

(Continued)

OTHER PUBLICATIONS

Machine English Translation of JP2009130831A Published on Jun. 11, 2009.*

(Continued)

*Primary Examiner* — Rakesh B Patel
*Assistant Examiner* — Jorge L Salazar, Jr.
(74) *Attorney, Agent, or Firm* — Pearne & Gordon LLP

(57) ABSTRACT

A variable filter circuit includes: a series arm connected in series between a signal input terminal and a signal output terminal; a parallel arm connected between the series arm and a ground terminal that has a resonator; and a variable reactance portion in the parallel arm, and the resonator of a parallel arm at an initial stage connected to the signal input terminal that has a resonant frequency fr and an anti-resonant frequency fa that satisfy $100\times(\text{fn}-\text{fr})/(\text{fa}-\text{fr}) \leq 23.9$ (%) for communication bands for each of which a stop band is set so as to be close to a high-frequency side of a pass band, among the plurality of communication bands, where a resonant frequency is fr, an anti-resonant frequency is fa, and a cutoff frequency at a high-frequency side of a pass band of each communication band is fn.

13 Claims, 8 Drawing Sheets

(51) Int. Cl.
   *H03H 7/01*      (2006.01)
   *H03H 9/60*      (2006.01)
(52) U.S. Cl.
   CPC ........ *H03H 9/6403* (2013.01); *H03H 9/6483* (2013.01); *H03H 2210/012* (2013.01); *H03H 2210/025* (2013.01)
(58) Field of Classification Search
   USPC .................... 333/133, 187, 188, 193–196
   See application file for complete search history.

(56) References Cited

U.S. PATENT DOCUMENTS

| | | | |
|---|---|---|---|
| 2004/0119561 A1 | 6/2004 | Omote | |
| 2009/0251235 A1* | 10/2009 | Belot | ................ H03H 9/542 333/187 |
| 2011/0199168 A1* | 8/2011 | Kadota | ............ H03H 9/02559 333/195 |
| 2012/0313731 A1 | 12/2012 | Burgener et al. | |

FOREIGN PATENT DOCUMENTS

| | | |
|---|---|---|
| JP | 2004-173245 A | 6/2004 |
| JP | 2009-130831 A | 6/2009 |
| JP | 2013-239839 A | 11/2013 |
| JP | 2014-502803 A | 2/2014 |

OTHER PUBLICATIONS

International Search report for PCT/JP2015/084488 dated Feb. 2, 2016.
Written Opinion of the International Searching Authority issued in PCT/JP2015/084488 dated Feb. 2, 2016.

\* cited by examiner

FIG. 7A
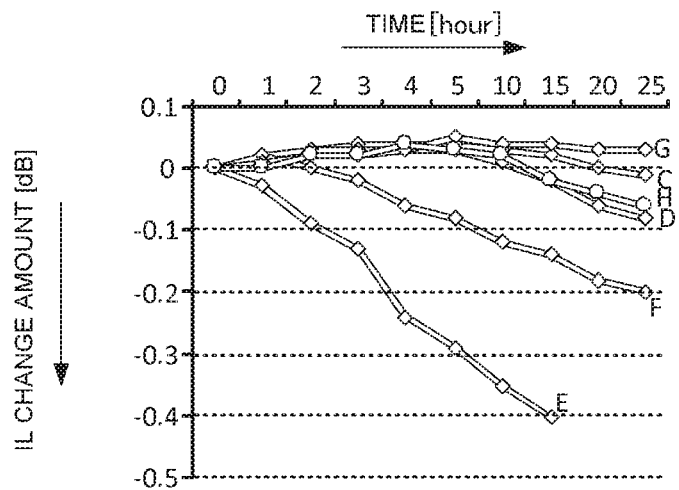
FIG. 7B
| SAMPLE | RESONANT FREQUENCY fr | ANTI-RESONANT FREQUENCY fa | INPUT FREQUENCY fn | (fn-fr)/(fa-fr) |
|---|---|---|---|---|
| A | 757MHz | 844.6MHz | 822.5MHz | 74.8% |
| B | 753MHz | 840.3MHz | 797.6MHz | 51.1% |
| C | 753MHz | 840.4MHz | 698.5MHz | -62.4% |
| D | 756.3MHz | 843.6MHz | 673.2MHz | -95.2% |
| E | 754.8MHz | 842.5MHz | 784.2MHz | 33.5% |
| F | 754MHz | 841.6MHz | 774.9MHz | 23.9% |
| G | 752.6MHz | 839.8MHz | 746.7MHz | -6.8% |
| H | 753.4MHz | 840.8MHz | 762.1MHz | 10.0% |
FIG. 7C
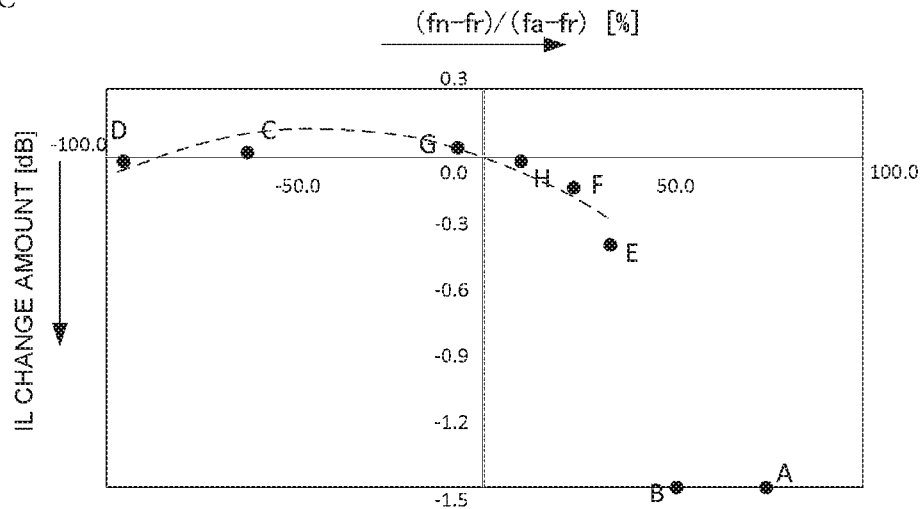

VARIABLE FILTER CIRCUIT

This application is a continuation of International Application No. PCT/JP2015/084488 filed on Dec. 9, 2015 which claims priority from Japanese Patent Application No. 2014-249531 filed on Dec. 10, 2014. The contents of these applications are incorporated herein by reference in their entireties.

BACKGROUND

Technical Field

The present invention relates to a variable filter circuit having variable filter characteristics.

In a front-end circuit of an existing communication device, in order to handle a plurality of communication signals having different frequency bands, a corresponding filter is provided for each communication signal. Thus, many filters are needed for handling many communication signals, so that there is a problem that the configuration becomes complicated and large in size. Thus, for reducing the circuit scale of the front-end circuit, a variable filter having adjustable filter characteristics is used in some cases (see, for example, Patent Documents 1 and 2).

Patent Document 1: Japanese Unexamined Patent Application Publication No. 6-232793

Patent Document 2: Japanese Unexamined Patent Application Publication (Translation of PCT Application) No. 2014-502803

BRIEF SUMMARY

The variable filter generally includes a resonance portion and a variable reactance portion. The resonance portion of such a variable filter has low impedance at a resonant frequency thereof. Thus, the amount of heat generated when power of a communication signal at approximately the resonant frequency is inputted is small. On the other hand, the resonance portion has high impedance at an anti-resonant frequency thereof, and thus the amount of heat generated when power of a communication signal at approximately the anti-resonant frequency is large. In addition, in the pass band of the variable filter, insertion loss becomes worst at approximately the cutoff frequency in many cases. Thus, also when power of a communication signal in a band near the cutoff frequency in the pass band is inputted, the amount of heat generated is large. In the variable filter, since the filter characteristics are variable, when the anti-resonant frequency of the resonance portion falls near the cutoff frequency of the pass band, the amount of heat generated by the resonance portion becomes excessive in some cases. When the resonance portion generates heat for these reasons, the insertion loss of the variable filter increases, resulting in malfunction of the variable filter, or breakdown of the variable filter occurs due to the heat generated by the resonance portion, in some cases.

The present disclosure mitigates or prevents the anti-resonant frequency of a resonance portion from falling near the cutoff frequency of a pass band, thereby improving electric power handling capability, in a variable filter circuit having adjustable filter characteristics.

The present disclosure is directed to a variable filter circuit for varying filter characteristics over a plurality of communication bands by adjusting a variable reactance, the variable filter circuit including: a series arm connected in series between a signal input terminal and a signal output terminal; a parallel arm connected between the series arm and a ground terminal and having a resonance portion; and a variable reactance portion provided in the parallel arm and having a variable reactance, wherein the resonance portion of a parallel arm at an initial stage connected to the signal input terminal has a resonant frequency fr and an anti-resonant frequency fa that satisfy $100\times(fn-fr)/(fa-fr)\leq 23.9$ (%) for all communication bands for each of which a stop band is set so as to be close to a high-frequency side of a pass band, among the plurality of communication bands, where a resonant frequency is denoted by fr, an anti-resonant frequency is denoted by fa, and a cutoff frequency at a high-frequency side of a pass band of each communication band is denoted by fn.

In the above conditional expression, 0% is achieved when the cutoff frequency at the high-frequency side of each communication band overlaps the low-frequency side from the resonant frequency of the resonance portion in the parallel arm at the initial stage, and 100% is achieved when the cutoff frequency at the high-frequency side of each communication band overlaps the low-frequency side from the anti-resonant frequency of the resonance portion in the parallel arm at the initial stage. That is, the above conditional expression indicates at which position the cutoff frequency at the high-frequency side of each communication band is located in a frequency band from the resonant frequency to the anti-resonant frequency of the resonance portion in the parallel arm at the initial stage. Therefore, the numerical range in the above conditional expression represents how much the frequency at which power by a signal in each communication band is inputted to the variable filter circuit shifts to the resonant frequency side from the anti-resonant frequency of the resonance portion in the parallel arm at the initial stage. According to the finding of the inventors of the present application, if the resonance portion provided in the parallel arm at the initial stage is set as described above, the vicinity of the cutoff frequency at the high-frequency side in the pass band of each communication signal does not include the anti-resonant frequency of the resonance portion at the initial stage, in the parallel arm at the initial stage to which greatest power is inputted, and the entirety of the pass band of each communication signal is located in a frequency band lower than the anti-resonant frequency of the resonance portion at the initial stage. Accordingly, excessive heat is less likely to be generated in the parallel arm at the initial stage, and excessive power input or heat does not occur in the parallel arm subsequent to the initial stage. Therefore, it is possible to inhibit deterioration of insertion loss at the time of power input in the variable filter circuit, and it is possible to improve the electric power handling capability of the variable filter circuit.

Further, the resonance portion of the parallel arm at the initial stage may have a resonant frequency fr and an anti-resonant frequency fa that satisfy $-95.2(\%)\leq 100\times(fn-fr)/(fa-fr)\leq 10.0(\%)$.

Accordingly, heat is further less likely to be generated in the parallel arm at the initial stage to which greatest power is inputted, and it is possible to further inhibit deterioration of insertion loss at the time of power input.

The parallel arm at the initial stage may further include an inductor connected in series or in parallel with the resonance portion.

With this configuration, it is possible to expand a frequency range where it is possible to perform filter characteristics control by adjusting the variable reactance.

The series arm may have an inductive reactance.

With this configuration, it is possible to make the attenuation characteristics at the high-frequency side of the pass band steep.

According to the present disclosure, in the variable filter circuit having adjustable filter characteristics, the anti-resonant frequency of the resonance portion at the initial stage is prevented from falling near the cutoff frequency at the high-frequency side of each of the plurality of communication bands, so that it is possible to improve the electric power handling capability.

BRIEF DESCRIPTION OF THE SEVERAL VIEWS OF THE DRAWINGS

FIGS. 7A-7C are diagrams illustrating the results of the power input test.

DETAILED DESCRIPTION

Hereinafter, a plurality of embodiments for carrying out the present disclosure will be described by several specific examples with reference to the drawings. In each drawing, the same parts are designated by the same reference signs. Each embodiment is illustrative, and it is needless to say that partial replacement or combination of the components described in different embodiments can be made.

First Embodiment

Figure 1:
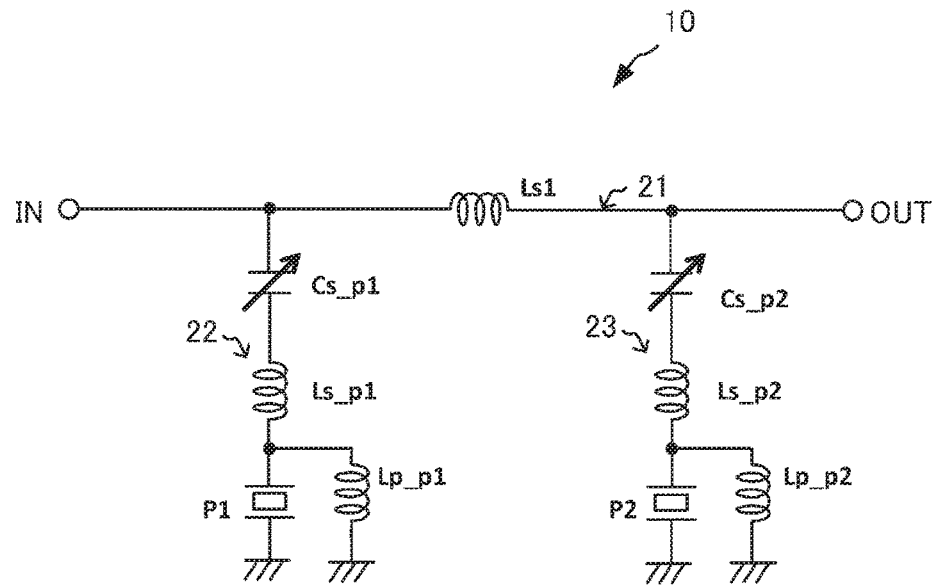
FIG. 1 is a circuit diagram of a variable filter circuit according to a first embodiment.

FIG. 1 is a circuit diagram of a variable filter circuit 10 according to a first embodiment of the present disclosure.

The variable filter circuit 10 is configured as a π type circuit connected between a signal input terminal IN and a signal output terminal OUT, and includes a series arm 21 and parallel arms 22 and 23. Appropriate matching circuits may be provided at the signal input terminal IN and the signal output terminal OUT. The series arm 21 is connected in series between the signal input terminal IN and the signal output terminal OUT. The parallel arm 22 is connected at one end thereof to the signal input terminal IN-side end of the series arm 21 and is connected at another end thereof to a ground connection terminal. The parallel arm 23 is connected at one end thereof to the signal output terminal OUT-side end of the series arm 21 and is connected at another end thereof to the ground connection terminal.

The series arm 21 includes an inductor Ls1. The inductor Ls1 has an inductive reactance and is inserted in series into the series arm 21.

The parallel arm 22 includes a variable capacitance Cs_p1, a series inductor Ls_p1, a resonator P1, and a parallel inductor Lp_p1. The variable capacitance Cs_p1 is connected at an end thereof to the signal input terminal IN-side end of the series arm 21 and is connected at another end thereof to the series inductor Ls_p1. The series inductor Ls_p1 is connected at an end thereof to the variable capacitance Cs_p1 and is connected at another end thereof to the resonator P1. The resonator P1 is connected at an end thereof to the series inductor Ls_p1 and is connected at another end thereof to the ground connection terminal. The parallel inductor Lp_p1 is connected at an end thereof to a connection point between the series inductor Ls_p1 and the resonator P1 and is connected at another end thereof to the ground connection terminal.

Similarly, the parallel arm 23 includes a variable capacitance Cs_p2, a series inductor Ls_p2, a resonator P2, and a parallel inductor Lp_p2. The variable capacitance Cs_p2 is connected at an end thereof to the signal output terminal OUT-side end of the series arm 21 and is connected at another end thereof to the series inductor Ls_p2. The series inductor Ls_p2 is connected at an end thereof to the variable capacitance Cs_p2 and is connected at another end thereof to the resonator P2. The resonator P2 is connected at an end thereof to the series inductor Ls_p2 and is connected at another end thereof to the ground connection terminal. The parallel inductor Lp_p2 is connected at an end thereof to a connection point between the series inductor Ls_p2 and the resonator P2 and is connected at another end thereof to the ground connection terminal.

The resonators P1 and P2 may be any components as long as the components have resonant characteristics. Piezoelectric resonators such as SAW resonators and BAW resonators, dielectric coaxial resonators, LC resonant circuits, or the like may be used. In addition, the variable capacitances Cs_p1 and Cs_p2 have variable reactances, and instead of the variable capacitances Cs_p1 and Cs_p2, for example, circuits or elements having variable inductances may be used as long as the circuits or elements have variable reactances. Moreover, the elements and the characteristics of the inductor Ls1, a capacitor Cs1, the series inductors Ls_p1 and Ls_p2, and the parallel inductors Lp_p1 and Lp_p2 may be set as appropriate.

Next, the function of each element forming the variable filter circuit 10 will be described.

Figure 2:
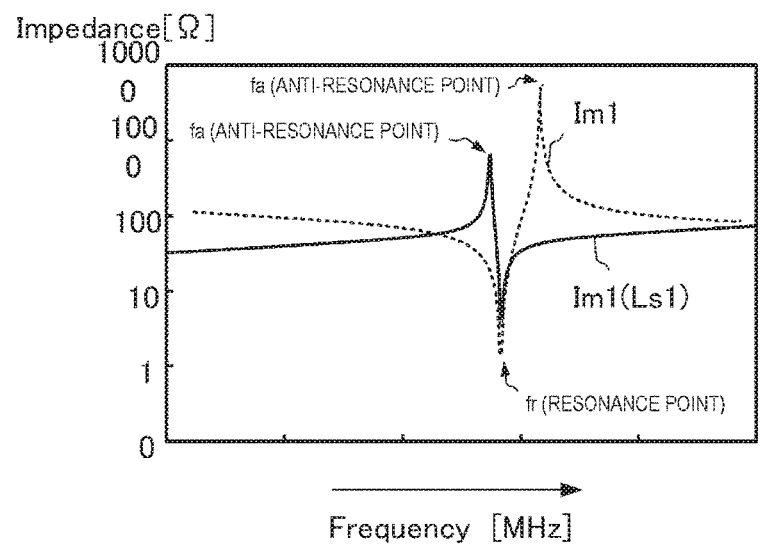
FIG. 2 is an impedance characteristic diagram illustrating the function of a reactance provided in a series arm of the variable filter circuit according to the first embodiment.

FIG. 2 is an impedance characteristic diagram illustrating the function of the inductor Ls1. The dotted line in FIG. 2 schematically represents impedance characteristics Im1 of the resonator P1 or the resonator P2 as a single unit. In addition, the solid line in FIG. 2 schematically represents impedance characteristics Im1(Ls1) of the resonator P1 or the resonator P2 in a state where the inductor Ls1 is connected.

In the impedance characteristics Im1, an anti-resonance point fa appears near the high-frequency side of a resonance point fr. Meanwhile, in the impedance characteristics Im1 (Ls1), an anti-resonance point fa at the high-frequency side of the resonance point fr shifts so as to be greatly away from the resonance point fr, and an anti-resonance point fa at the low-frequency side of the resonance point fr shifts so as to be close to the resonance point fr. Because of this, in the impedance characteristics Im1(Ls1), the anti-resonance point fa appears near the low-frequency side of the resonance point fr.

Figure 3:
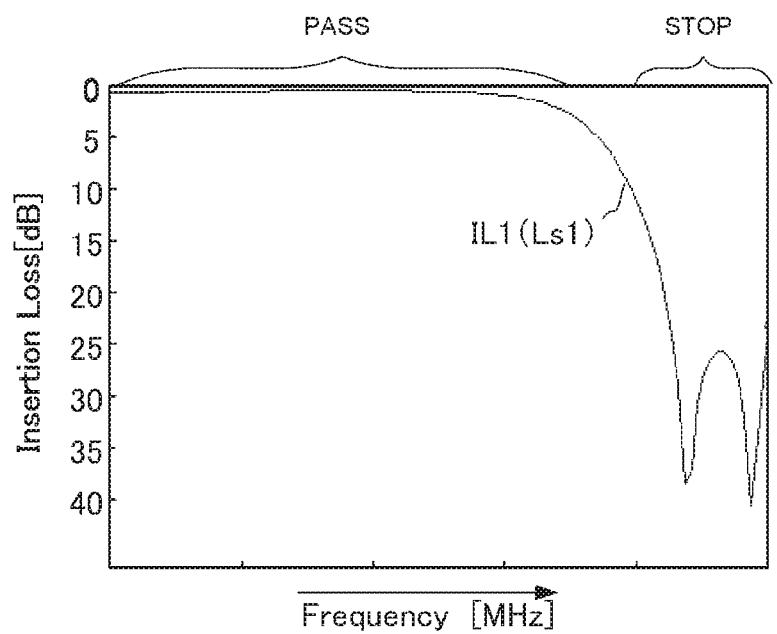
FIG. 3 is a bandpass characteristic diagram illustrating the function of the reactance provided in the series arm of the variable filter circuit according to the first embodiment.

FIG. 3 is a bandpass characteristic diagram illustrating bandpass characteristics IL1(Ls1) of the variable filter circuit 10.

In the bandpass characteristics IL1(Ls1), it is possible to provide a pass band at the low-frequency side of a stop band generated near the resonance point of the resonator P1 or P2, and attenuation characteristics become steep between the stop band and the pass band at the low-frequency side. This is because, when the inductor Ls1 is connected, an anti-resonance point fa appears near the low-frequency side of the resonance point fr in the impedance characteristics Im1(Ls1).

Figure 4A:
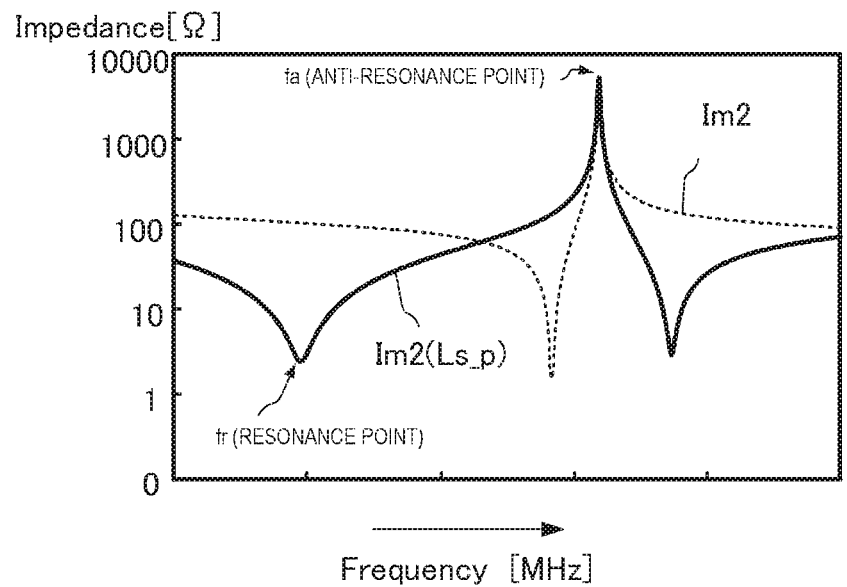
FIGS. 4A and 4B are impedance characteristic diagrams illustrating the functions of inductors provided in parallel arms of the variable filter circuit according to the first embodiment.

FIG. 4A is an impedance characteristic diagram illustrating the functions of the series inductors Ls_p1 and Ls_p2. The dotted line in FIG. 4A represents impedance characteristics Im2 of the resonator P1 or the resonator P2 as a single unit. In addition, the solid line in FIG. 4A represents impedance characteristics Im2(Ls_p) of the resonator P1 or the resonator P2 in a state where the series inductor Ls_p1 or the series inductor Ls_p2 is connected.

When the impedance characteristics Im2(Ls_p) and the impedance characteristics Im2 are compared to each other, the frequencies of the anti-resonance points fa are the same, but the frequency of the resonance point fr in the impedance characteristics Im2(Ls_p) shifts to a frequency at a lower-frequency side than that in the impedance characteristics Im2. That is, each of the series inductors Ls_p1 and Ls_p2 has a function to shift the resonance point fr of the resonator P1 or the resonator P2 to the low-frequency side.

Figure 4B:
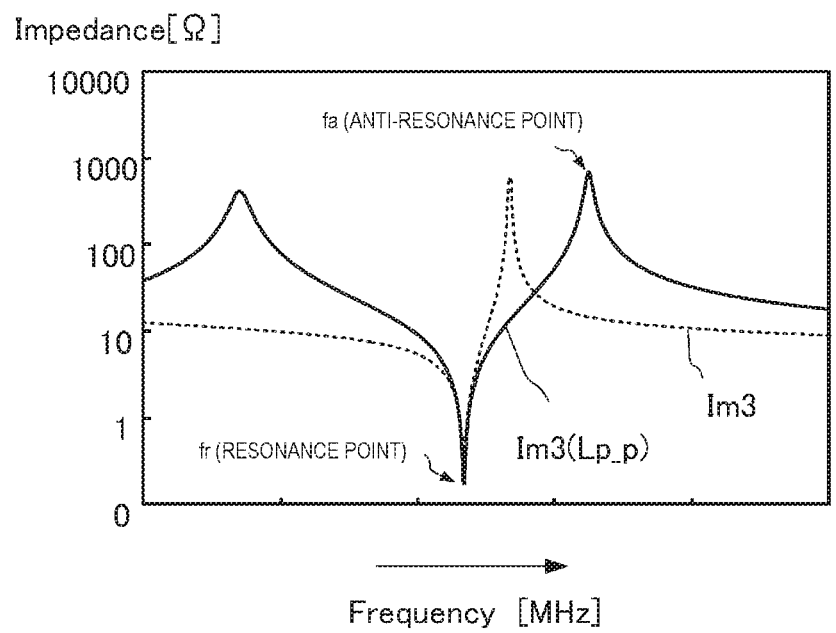

FIG. 4B is an impedance characteristic diagram illustrating the functions of the parallel inductors Lp_p1 and Lp_p2. The dotted line in FIG. 4B represents impedance characteristics Im3 of the resonator P1 or the resonator P2 as a single unit. In addition, the solid line in FIG. 4B represents impedance characteristics Im3(Lp_p) of the resonator P1 or the resonator P2 in a state where the parallel inductor Lp_p1 or Lp_p2 is connected.

When the impedance characteristics Im3(Lp_p) and the impedance characteristics Im3 are compared to each other, the frequencies of the resonance points fr are the same, but the frequency of the anti-resonance point fa in the impedance characteristics Im3(Lp_p) shifts to a frequency at a higher-frequency side than that in the impedance characteristics Im3. That is, each of the parallel inductors Lp_p1 and Lp_p2 has a function to shift the anti-resonance point fa of the resonator P1 or the resonator P2 to the high-frequency side.

Next, the functions of the variable capacitances Cs_p1 and Cs_p2 will be described.

Figure 5A:
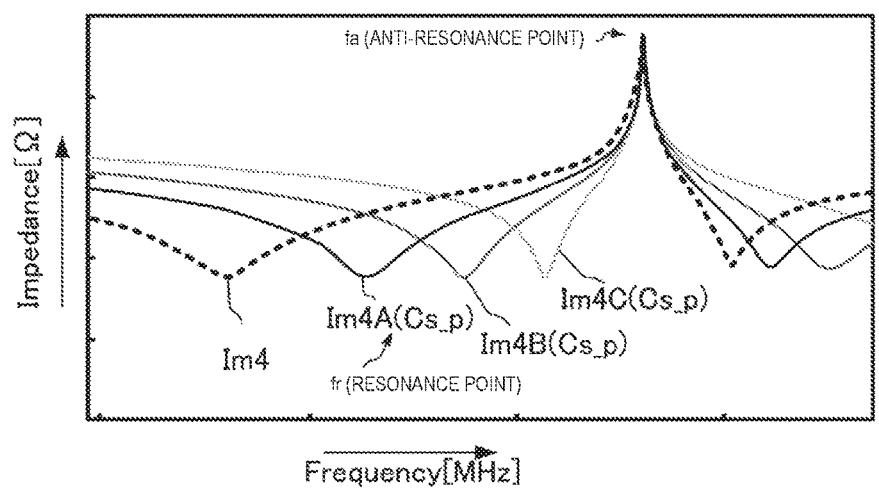
FIGS. 5A and 5B are characteristic diagrams illustrating the functions of variable capacitances provided in the parallel arms of the variable filter circuit according to the first embodiment.

FIG. 5A is an impedance characteristic diagram illustrating the functions of the variable capacitances Cs_p1 and Cs_p2. Impedance characteristics Im4A(Cs_p), Im4B(Cs_p), and Im4C(Cs_p) represented by the solid lines in FIG. 5A are set such that the capacitance of the variable capacitance Cs_p1 or Cs_p2 is lower in order of the description thereof.

In the impedance characteristics Im4A(Cs_p), Im4B(Cs_p), and Im4C(Cs_p), the frequencies of the anti-resonance points fa are the same, but as the capacitance of the variable capacitance Cs_p1 or Cs_p2 decreases, the frequency of the resonance point fr comes closer to the anti-resonance point fa and is located at a higher-frequency side.

Figure 5B:
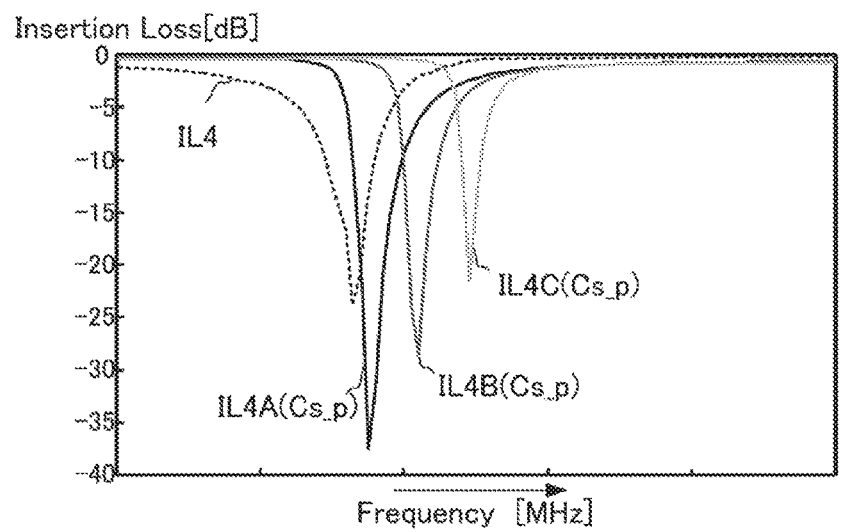

FIG. 5B is a bandpass characteristic diagram of the variable filter circuit 10. Bandpass characteristics IL4A(Cs_p), IL4B(Cs_p), and IL4C(Cs_p) represented by the solid lines in FIG. 5B are set such that the capacitance of the variable capacitance Cs_p1 or Cs_p2 is lower in order of the description thereof. In the bandpass characteristics IL4A(Cs_p), IL4B(Cs_p), and IL4C(Cs_p), the stop band shifts to a higher-frequency side as the capacitance of the variable capacitance Cs_p1 or Cs_p2 decreases. As described above, each of the variable capacitances Cs_p1 and Cs_p2 has a function to shift the resonance point fr or the stop band of the resonator P1 or P2 to a higher-frequency side.

However, even when the capacitance of the variable capacitance Cs_p1 or Cs_p2 is controlled to be very low, it is not possible to adjust the stop band to a high-frequency side beyond a predetermined frequency. This is because, in the impedance characteristics, it is not possible to adjust the frequency of the resonance point fr to a high-frequency side beyond the frequency of the anti-resonance point fa, and the frequency variable range of the stop band is limited to the band between the anti-resonance point fa and the resonance point fr in the case where the variable capacitance Cs_p1 or Cs_p2 is not present. Therefore, when the series inductors Ls_p1 and Ls_p2 and the parallel inductors Lp_p1 and Lp_p2 are connected to the resonators P1 and P2 to expand the band between the resonance point fr and the anti-resonance point fa as described with reference to FIGS. 4A and 4B, it is possible to expand the frequency variable range of the stop band.

The basic circuit configuration and the circuit functions of the variable filter circuit 10 are as described above, and the variable filter circuit 10 functions as a low pass filter in which the stop band and the cutoff frequency at the high-frequency side of the pass band are adjustable.

In such a variable filter circuit 10, in the present disclosure, the resonant frequency fr and the anti-resonant frequency fa of the resonator P1 in the parallel arm 22 at the initial stage seen from the signal input terminal IN are determined for all of a plurality of communication bands supported by the variable filter circuit 10 such that 100×(fn−fr)/(fa−fr)≤23.9(%) is satisfied where the cutoff frequency at the high-frequency side of the pass band of each communication band is denoted by fn.

Here, a test used for deriving the above conditional expression and the results thereof will be described.

Figure 6A:
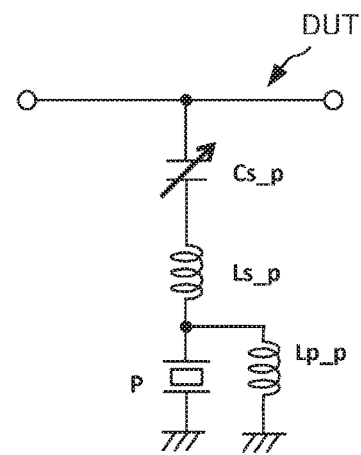
FIGS. 6A and 6B are circuit diagrams of a test target circuit according to a power input test and a block diagram of a test apparatus.
Figure 6B:
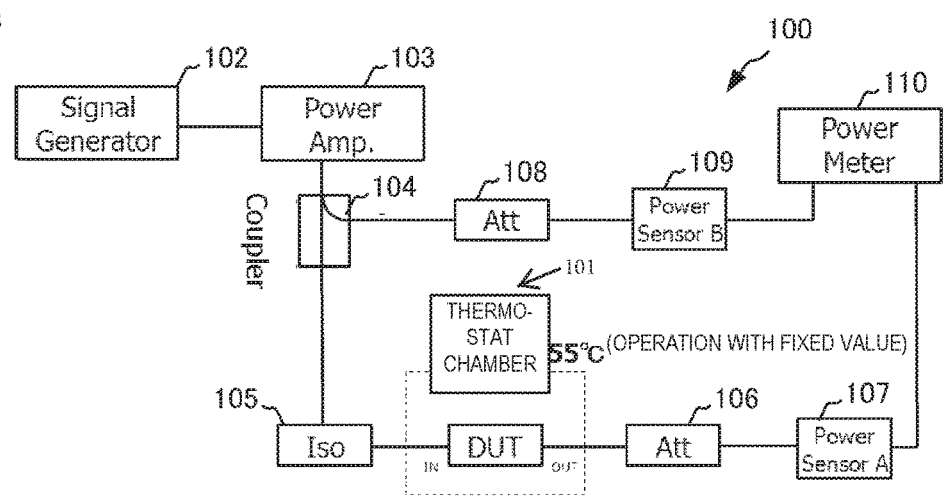

The inventors of the present application conducted a power input test on the circuit configuration of the parallel arm included in the variable filter circuit 10 in order to confirm electric power handling capability, and derived the above conditional expression on the basis of the results of the power input test. FIG. 6A is a circuit diagram of a parallel arm circuit DUT on which the power input test was conducted. The parallel arm circuit DUT has the same circuit configuration as that of the parallel arm at the initial stage included in the variable filter circuit 10. The resonator P1 used in the test is composed of a SAW resonator. FIG. 6B is a block diagram of a test apparatus 100 with which the power input test was conducted.

In the power input test on the parallel arm circuit DUT, power was inputted at a frequency at which insertion loss (I.L.) generated in a sample of the parallel arm circuit DUT under a predetermined temperature environment was −3 dB, and change of the insertion loss over time was measured.

Specifically, the parallel arm circuit DUT was put into a thermostat chamber 101 of the test apparatus 100, and power of 2.5 W was outputted from a signal generator 102 via a power amplifier 103, a coupler 104, and an isolator 105 to an input terminal of the parallel arm circuit DUT at a frequency at which the insertion loss of the parallel arm circuit DUT at normal temperature was −3 dB. After elapse of a predetermined time, power was detected by a power sensor 107 connected to an output terminal of the parallel arm circuit DUT via an attenuator 106 and a power sensor 109 connected via the coupler 104 and an attenuator 108, an input signal to the parallel arm circuit DUT and an output signal from the parallel arm circuit DUT were compared to each other by a power meter 110, and the frequency at which the insertion loss (I.L.) of the parallel arm circuit DUT was −3 dB was measured. Then, power was continuously inputted at this frequency, and change of the insertion loss over time was measured.

FIG. 7A is a graph showing temporal change of insertion loss of each sample obtained by conducting the above power input test on a plurality of samples.

In the power input test, 8 samples including samples A to H were used in total. In the respective samples, parallel arm circuits having SAW resonators having resonant frequencies and anti-resonant frequencies that are substantially equal to each other were used. As a result of the power input test, breakdown occurred immediately after the power input in the sample A and the sample B, and in the other samples C to H, change of an attenuation was observed after the power input, but the amount of the change was small and the performance was maintained. However, in the sample F and the sample E of the other samples, the amount of the change of the attenuation gradually increased over time, and breakdown finally occurred in the sample E after elapse of about 15 hours. As described above, even with the samples having similar frequency characteristics, the electric power handling capabilities thereof were varied.

Thus, from the standpoint of the relationship of the power input frequency with respect to the resonant frequency and the anti-resonant frequency of the resonator, that is, from the standpoint of which position the power input frequency is located at with respect to the frequency band from the resonant frequency of the resonator in the parallel arm circuit DUT to the anti-resonant frequency of the resonator, the inventors of the present application evaluated the electric power handling capability of the parallel arm circuit. FIG. 7B is a table that shows the details of the frequency characteristics of each sample and the relationship between the above-described conditional expression and the input frequency at which power was actually inputted in the above-described power input test. FIG. 7C is a graph showing the above-described conditional expression, that is, the relationship between an IL change amount and the ratio of the difference (fn−fr) between the power input frequency and the resonant frequency of the resonator relative to a specific band (fa−fr) of the resonator in each sample. When the ratio of the difference (fn−fr) between the power input frequency and the resonant frequency of the resonator relative to the specific band (fa−fr) of the resonator takes a positive (+) value, it means that the power input frequency is at the anti-resonance point side as seen from the resonance point; when the ratio takes a negative (−) value, it means that the power input frequency is at the side opposite to the anti-resonance point as seen from the resonance point; and when the ratio is 0, it means that the power input frequency is equal to the frequency of the resonance point.

FIG. 7C shows an IL change amount at elapse of 15 hours after the power input, and the IL change amounts of the sample A and the sample B that had already broken down are shown as a maximum value (−1.5 dB) in the drawing.

From this analysis, the above-described conditional expression and the IL change amount have a correlation to a certain degree, and a tendency is confirmed in which occurrence of breakdown (the samples A, B, and E) no longer occurred when the power input frequency shifted from the anti-resonant frequency of the resonator to the resonant frequency side by a certain ratio or more (the sample F or more). In addition, a phenomenon is also confirmed in which the IL change amount gradually increased when the power input frequency further shifted to the resonant frequency side (the sample H or more).

That is, it is thought that when the conditional expression 100×(fn−fr)/(fa−fr) is equal to or less than 23.9% which is the value in the sample F, it is possible to inhibit an increase in the amount of heat generated at the time of the power input, so that it is possible to prevent occurrence of breakdown (the samples A, B, and E). In addition, it is thought that when the conditional expression 100×(fn−fr)/(fa−fr) is equal to or less than 10.0% which is the value in the sample H, it is possible to considerably inhibit an increase in the amount of heat generated at the time of the power input, so that it is possible to prevent gradual increase of the IL change amount.

When the conditional expression 100×(fn−fr)/(fa−fr) was negative, a phenomenon in which the insertion loss greatly deteriorated at the time of the power input was not confirmed. However, from FIG. 7C, it is thought that at least when the conditional expression 100×(fn−fr)/(fa−fr) is equal to or greater than −95.2% which is the value in the sample D, it is possible to prevent deterioration of the insertion loss at the time of the power input.

Because of the above, by using a resonator having a resonant frequency fr and an anti-resonant frequency fa that satisfy 100×(fn−fr)/(fa−fr)≤23.9(%) for each communication band supported by the variable filter circuit 10 where a resonant frequency is denoted by fr, an anti-resonant frequency is denoted by fa, and the cutoff frequency at the high-frequency side of the pass band of each communication band is denoted by fn, in the parallel arm at the initial stage to which greatest power is inputted, of the respective parallel arms forming the variable filter circuit 10, it is possible to prevent the vicinity of the cutoff frequency at the high-frequency side in the pass band of each communication signal from including the anti-resonant frequency of the resonance portion at the initial stage. Accordingly, the entirety of the pass band of each communication signal is located in a frequency band lower than the anti-resonant frequency of the resonance portion at the initial stage. Therefore, it is possible to make excessive heat less likely to be generated in the parallel arm at the initial state, it is possible to inhibit deterioration of insertion loss at the time of the power input in the variable filter circuit, and it is possible to improve the electric power handling capability of the variable filter circuit. In addition, more suitably, it can be said that when the resonance portion of the parallel arm at the initial stage has a resonant frequency fr and an anti-resonant frequency fa that satisfy −95.2(%)≤100×(fn−fr)/(fa−fr)≤10.0(%), it is possible to considerably inhibit deterioration of insertion loss at the time of the power input. Then, if it is possible to inhibit deterioration of insertion loss at the time of the power input as described above, desired insertion loss is easily achieved for each of a plurality of communication bands, and it is also possible to reduce the chip size of the variable filter circuit 10 by reducing the number of stages of the parallel arms and the resonance portions.

Next, specific specifications according to an example of the variable filter circuit 10 will be described.

The variable filter circuit 10 according to the example is caused to support the transmission frequency bands of the communication band BAND12, the communication band BAND17, and the communication band BAND28H specified by the LTE standard or the like. Each of the communication band BAND12, the communication band BAND17, and the communication band BAND28H is a communication band for which a reception frequency band that should be a stop band is set so as to be close to a high-frequency side of a transmission frequency band that should be a pass band. Specifically, the transmission frequency band of the communication band BAND12 is 699 to 716 MHz, and the reception frequency band of the communication band BAND12 is 729 to 746 MHz. The transmission frequency band of the communication band BAND17 is 704 to 716 MHz, and the reception frequency band of the communication band BAND17 is 734 to 746 MHz. The transmission frequency band of the communication band BAND28H is 728 to 748 MHz, and the reception frequency band of the communication band BAND28H is 783 to 803 MHz.

Here, in consideration of electric power handling capability in the case of performing adjustment such that the pass band is adjusted to the transmission frequency band of each communication band and the stop band at the high-frequency side of the pass band is adjusted to the reception frequency band of the communication band by adjusting the variable capacitance in the variable filter circuit 10 according to the example, the resonant frequency fr and the anti-resonant frequency fa of the resonator P1 in the parallel arm 22 at the initial stage need to be set for each of the communication band BAND12, the communication band BAND 17, and the communication band BAND28H such that $100 \times (fn-fr)/(fa-fr) \leq 23.9(\%)$ is satisfied where the cutoff frequency at the high-frequency side of the pass band of each communication band is denoted by fn.

For example, in the case where the resonant frequency fr of the resonator P1 is set to 746 MHz and the anti-resonant frequency fa of the resonator P1 is set to 777 MHz, the conditional expression for the communication band BAND12 is $100 \times (fn-fr)/(fa-fr) = -96.8(\%)$ since the cutoff frequency at the high-frequency side of the pass band of the communication band BAND12 is 716 MHz, and the above conditional expression is satisfied. The conditional expression for the communication band BAND17 is $100 \times (fn-fr)/(fa-fr) = -96.8(\%)$ since the cutoff frequency at the high-frequency side of the pass band of the communication band BAND17 is 716 MHz, and the above conditional expression is satisfied. In addition, the conditional expression for the communication band BAND28H is $100 \times (fn-fr)/(fa-fr) = 6.45(\%)$ since the cutoff frequency at the high-frequency side of the pass band of the communication band BAND28H is 748 MHz, and the above conditional expression is satisfied.

Therefore, in the variable filter circuit 10, the frequency at which power by communication signals in the communication bands BAND12, BAND17, and BAND28H is inputted is greatly shifted from the anti-resonant frequency 777 MHz of the resonator P1 of the parallel arm 22 at the initial stage to a resonant frequency of 746 MHz, and excessive heat is less likely to be generated in the resonator P1 of the parallel arm 22 at the initial stage to which greatest power is inputted, so that it is possible to inhibit deterioration of insertion loss at the time of power input and further prevent breakdown of the resonator. Accordingly, even when the number of stages of the parallel arms in the variable filter circuit 10 is small, it is easy to achieve desired filter characteristics, and it is possible to reduce the number of stages of the parallel arms to reduce the circuit scale or the circuit size.

Second Embodiment

Figure 8:
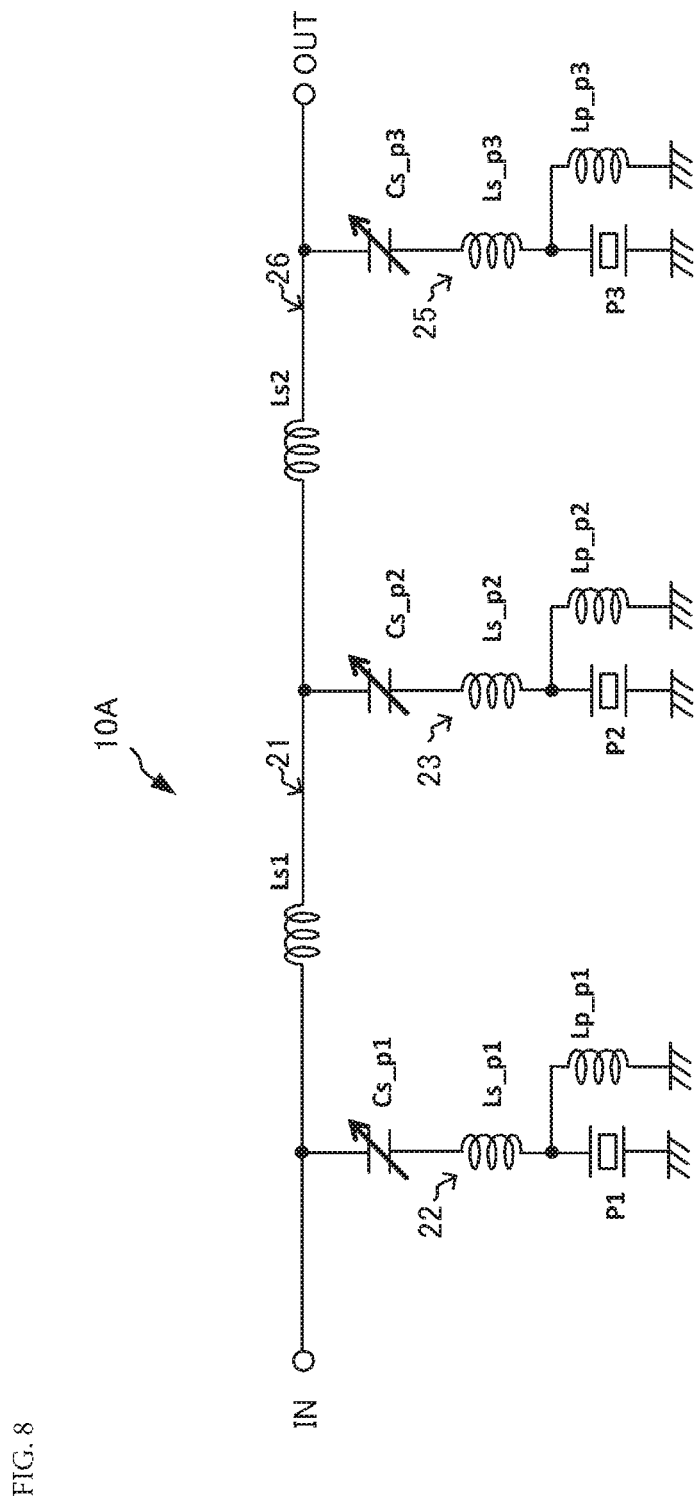
FIG. 8 is a circuit diagram of a variable filter circuit according to a second embodiment.

FIG. 8 is a circuit diagram of a variable filter circuit 10A according to a second embodiment of the present disclosure.

The variable filter circuit 10A has a configuration in which a series arm 26 is added between the series arm 21 and the signal output terminal OUT in the configuration of the first embodiment and a parallel arm 25 is added to a signal output terminal OUT-side end of the series arm 26. In the variable filter circuit 10A, the parallel arm 23 and the added series arm 26 and parallel arm 25 form a second π type circuit. In the variable filter circuit according to the present disclosure, the numbers of stages of the series arms and the parallel arms may be increased as described above, and it is possible to increase the attenuation in the stop band by increasing the number of stages of the series arms and the parallel arms.

Third Embodiment

Figure 9:
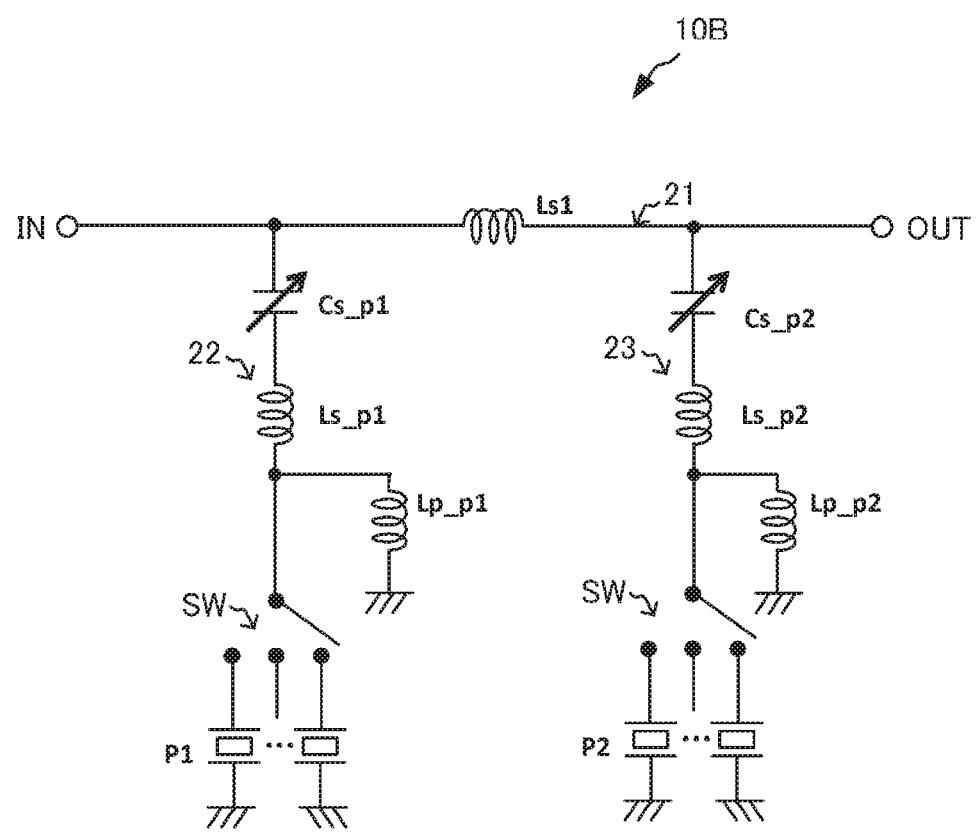
FIG. 9 is a circuit diagram of a variable filter circuit according to a third embodiment.

FIG. 9 is a circuit diagram of a variable filter circuit 10B according to a third embodiment of the present disclosure.

The variable filter circuit 10B is configured such that switches SW are added to the parallel arm 22 and the parallel arm 23 in the configuration of the first embodiment, a plurality of resonators P1 or P2 having characteristics different from each other are added to each of the parallel arm 22 and the parallel arm 23, and frequency characteristics are switched also by switching the switches SW. In the variable filter circuit according to the present disclosure, a plurality of resonators may be provided in each parallel arm as described above. In such a case as well, since it is not necessary to increase the total number of the variable capacitances, it is possible to increase the communication bands that can be supported by the variable filter circuit, while the circuit scale is reduced.

The present disclosure may be carried out as described above in each embodiment. The present disclosure may be carried out with any configuration other than the configurations described in the respective embodiments and the modifications described above, as long as the configuration is a configuration corresponding to the recitation of the claims. For example, capacitive reactances may be provided in the series arm of the variable filter circuit, and an inductive reactance or a circuit for switching between the capacitive reactance and the capacitive reactance may also be provided therein. At least an inductive reactance may be provided in the series arm, and because of this, it is possible to achieve steep attenuation characteristics between a pass band and a stop band when the stop band adjacent to the high-frequency side of the pass band is achieved. In addition, other than providing both a parallel inductor and a series inductor in the parallel arm, only either a parallel inductor or a series inductor may be provided in the parallel arm, or both a parallel inductor and a series inductor may not be provided in the parallel arm.

REFERENCE SIGNS LIST 10, 10A, 10B variable filter circuit
11 input-stage matching circuit
12, 12A π type circuit
13 output-stage matching circuit
21, 26 series arm
22, 23, 25 parallel arm
24 switching circuit
100 test apparatus
101 thermostat chamber
102 signal generator
103 power amplifier
104 coupler
105 isolator
106, 108 attenuator
107, 109 power detector
110 power meter

The invention claimed is:

1. A variable filter circuit for varying filter characteristics over a plurality of communication bands by adjusting a variable reactance element, the variable filter circuit comprising:
a series arm connected in series between an input terminal and an output terminal;
a parallel arm connected between an input terminal side of the series arm and ground, the parallel arm comprising a resonating element, and the variable reactance element,
wherein for each signal input to the input terminal, $100\times(fn-fr)/(fa-fr)$ is less than or equal to 23.9 for the resonating element, and
wherein fr is a resonant frequency of the resonating element, fa is an anti-resonant frequency of the resonating element, and fn is a cutoff frequency of the filter circuit at a high-frequency side of a pass band of the filter circuit for a communication band of each signal.

2. The variable filter circuit according to claim 1, wherein $100\times(fn-fr)/(fa-fr)$ is greater than or equal to −95.2 and is less than or equal to 10.0.

3. The variable filter circuit according to claim 2, wherein the parallel arm further comprises an inductor connected in series or in parallel with the resonating element.

4. The variable filter circuit according to claim 3, wherein the series arm comprises an inductive reactance, and the parallel arm is connected to the series arm at an input terminal side of the inductive reactance.

5. The variable filter circuit according to claim 2, wherein the series arm comprises an inductive reactance, and the parallel arm is connected to the series arm at an input terminal side of the inductive reactance.

6. The variable filter circuit according to claim 1, wherein the parallel arm further comprises an inductor connected in series or in parallel with the resonating element.

7. The variable filter circuit according to claim 6, wherein the series arm comprises an inductive reactance, and the parallel arm is connected to the series arm at an input terminal side of the inductive reactance.

8. The variable filter circuit according to claim 1, wherein the series arm comprises an inductive reactance, and the parallel arm is connected to the series arm at an input terminal side of the inductive reactance.

9. The variable filter circuit according to claim 1, wherein the parallel arm further comprises a switch and the resonating element comprises a plurality of resonating elements, the switch being configured to selectively connect one of the plurality of resonating elements to the variable reactance element based on the communication band of a signal input to the input terminal.

10. A variable filter circuit for varying filter characteristics over a plurality of communication bands by adjusting a variable reactance element, the variable filter circuit comprising:
a series arm connected in series between an input terminal and an output terminal; and
a parallel arm connected between an input terminal side of the series arm and ground, the parallel arm comprising a resonating element, and the variable reactance element,
wherein for each signal input to the input terminal, an entirety of a pass band of the filter circuit is less than the anti-resonant frequency of the resonating element, and
wherein the parallel arm further comprises an inductor connected in series or in parallel with the resonating element.

11. The variable filter circuit according to claim 10, wherein the series arm comprises an inductive reactance, and the parallel arm is connected to the series arm at an input terminal side of the inductive reactance.

12. A variable filter circuit for varying filter characteristics over a plurality of communication bands by adjusting a variable reactance element, the variable filter circuit comprising:
a series arm connected in series between an input terminal and an output terminal; and
a parallel arm connected between an input terminal side of the series arm and ground, the parallel arm comprising a resonating element, and the variable reactance element,
wherein for each signal input to the input terminal, an entirety of a pass band of the filter circuit is less than the anti-resonant frequency of the resonating element, and
wherein the series arm comprises an inductive reactance, and the parallel arm is connected to the series arm at an input terminal side of the inductive reactance.

13. A variable filter circuit for varying filter characteristics over a plurality of communication bands by adjusting a variable reactance element, the variable filter circuit comprising:
a series arm connected in series between an input terminal and an output terminal; and
a parallel arm connected between an input terminal side of the series arm and ground, the parallel arm comprising a plurality of resonating elements, the variable reactance element, and a switch,
wherein for each signal input to the input terminal, an entirety of a pass band of the filter circuit is less than the anti-resonant frequency of the resonating element, and
wherein the switch is configured to selectively connect one of the plurality of resonating elements to the variable reactance element based on the communication band of a signal input to the input terminal.

* * * * *